United States Patent
Chiu et al.

(10) Patent No.: US 7,772,902 B2
(45) Date of Patent: Aug. 10, 2010

(54) PWM BUFFER CIRCUIT FOR ADJUSTING A FREQUENCY AND A DUTY CYCLE OF A PWM SIGNAL

(75) Inventors: Chun-lung Chiu, Changhua County (TW); Wen-shi Huang, Taoyuan County (TW)

(73) Assignee: Delta Electronics, Inc., Taoyuan (TW)

( * ) Notice: Subject to any disclaimer, the term of this patent is extended or adjusted under 35 U.S.C. 154(b) by 325 days.

(21) Appl. No.: 11/751,336

(22) Filed: May 21, 2007

(65) Prior Publication Data
US 2007/0216458 A1 Sep. 20, 2007

Related U.S. Application Data

(63) Continuation of application No. 10/657,181, filed on Sep. 9, 2003, now Pat. No. 7,279,947.

(51) Int. Cl.
*H03K 3/017* (2006.01)
(52) U.S. Cl. .................. 327/172; 327/175; 327/291
(58) Field of Classification Search .............. None
See application file for complete search history.

(56) References Cited

U.S. PATENT DOCUMENTS

| | | | |
|---|---|---|---|
| 5,457,435 A | 10/1995 | Hoffman | |
| 5,606,296 A | 2/1997 | Seong et al. | |
| 5,952,798 A | 9/1999 | Jones et al. | |
| 6,252,209 B1 | 6/2001 | Liepold | |
| 6,346,852 B1 | 2/2002 | Masini et al. | |
| 6,650,074 B1 | 11/2003 | Vyssotski et al. | |
| 6,703,803 B2 | 3/2004 | Ohiwa et al. | |

*Primary Examiner*—An T Luu
(74) *Attorney, Agent, or Firm*—Muncy, Geissler, Olds & Lowe, PLLC

(57) ABSTRACT

A PWM buffer circuit includes a duty cycle converting circuit and a frequency-fixed PWM signal generating circuit. The duty cycle converting circuit is used for receiving a first PWM signal and then generating a duty cycle reference voltage on the basis of the first PWM signal. The duty cycle reference voltage is a one-to-one mapping function of the first duty cycle. The frequency-fixed PWM signal generating circuit is used for receiving the duty cycle reference voltage and then outputting a second PWM signal with a fixed frequency. The second PWM signal has a second duty cycle, which is determined in accordance with the duty cycle reference voltage. In addition, the second duty cycle is a one-to-one mapping function of the duty cycle reference voltage.

15 Claims, 4 Drawing Sheets

PWM BUFFER CIRCUIT FOR ADJUSTING A FREQUENCY AND A DUTY CYCLE OF A PWM SIGNAL

This application is a Continuation of co-pending application Ser. No. 10/657,181 filed on Sept. 9, 2003, now U.S. Pat. No. 7,279,947, the entire contents of which are hereby incorporated by reference and for which priority is claimed under 35 U.S.C. §120.

BACKGROUND OF THE INVENTION

1. Field of the Invention

The present invention relates to a buffer circuit applied with a pulse width modulation (PWM) signal and, more particularly, to a PWM buffer circuit for adjusting a frequency and a duty cycle of a PWM signal.

2. Description of the Related Art

In recent years, a fan for dissipating heat generally operates with a fan motor whose speed is dominantly controlled through utilizing a PWM signal. FIG. 1 is a circuit block diagram showing a control circuit for speed of a fan motor by using a conventional PWM control method. Referring to FIG. 1, a PWM signal generation unit 10 outputs a PWM signal S1 to a driving circuit 11. Based on the PWM signal S1, the driving circuit 11 outputs a driving signal A to a fan motor 12, thereby controlling the speed of the fan motor 12. More specifically, one of signal characteristics of the PWM signal S1 is known as "duty cycle," i.e., a ratio of a pulse width to a period of the PWM signal S1. Assume that the duty cycle of the PWM signal S1 in FIG. 1 is denoted by a reference numeral D1. In the above-mentioned conventional PWM control method, when the duty cycle D1 of the PWM signal S1 is relatively large, the driving signal A output from the driving circuit 11 causes the fan motor 12 to operate at a relatively high speed. On the other hand, when the duty cycle D1 of the PWM signal S1 is relatively small, the driving signal A output from the driving circuit 11 causes the fan motor 12 to operate at a relatively low speed However, the conventional PWM control method has at least two disadvantages. The first one of the disadvantages is that the PWM signal S1 to be utilized must have a relatively high frequency, such as 10 kHz or more When the PWM signal S1 has a frequency lower than 10 kHz, the operation of the fan motor 12 is adversely influenced by switching noise. The second disadvantage is that the duty cycle D1 of the PWM signal S1 to be utilized must be restricted within a range between 30% and 85%, thereby ensuring that the driving circuit 11 and the fan motor 12 can be appropriately controlled by the PWM signal S1.

SUMMARY OF THE INVENTION

In view of the above-mentioned problems, an object of the present invention is to provide a PWM buffer circuit, arranged in a control circuit for speed of a fan motor, for expanding an applicable range of frequency of a PWM signal to be used as a control signal.

Another object of the present invention is to provide a PWM buffer circuit, arranged in a control circuit for speed of a fan motor, for expanding an applicable range of duty cycle of a PWM signal to be used as a control signal.

According to one aspect of the present invention, a PWM buffer circuit includes: a duty cycle converting circuit and a frequency-fixed PWM signal generating circuit. The duty cycle converting circuit receives a first PWM signal and then generates a duty cycle reference voltage based on a first duty cycle of the first PWM signal. The duty cycle reference voltage is a one-to-one mapping function of the first duty cycle. The frequency-fixed PWM signal generating circuit receives the duty cycle reference voltage and then outputs a second PWM signal having a fixed frequency. The second PWM signal has a second duty cycle determined on the basis of the duty cycle reference voltage, and the second duty cycle is a one-to-one mapping function of the duty cycle reference voltage.

According to another aspect of the present invention, a control circuit for speed of a fan motor includes: a PWM signal generation unit, a PWM buffer circuit, and a driving circuit. The PWM signal generation unit generates a first PWM signal having a first duty cycle. The PWM buffer circuit is coupled to the PWM signal generation unit for converting the first PWM signal into a second PWM signal having a fixed frequency and a second duty cycle. The driving circuit is coupled to the PWM buffer circuit for outputting a driving signal based on the second PWM signal to the fan motor, thereby controlling the speed of the fan motor.

In one preferred embodiment of the present invention, the first PWM signal has a frequency higher than 30 Hz and the first duty cycle is located between 5% and 95%. Therefore, the PWM buffer circuit according to the present invention may be arranged in a control circuit for speed of a fan motor so as to expand an applicable range of frequency of the PWM signal as well as an applicable range of duty cycle of the PWM signal.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
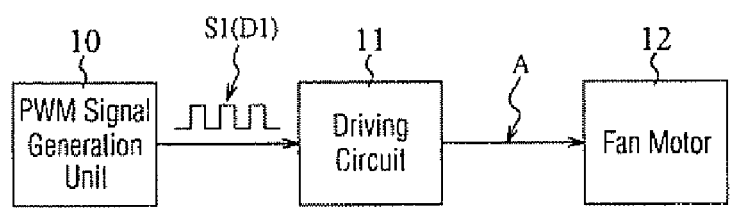
FIG. 1 is a circuit block diagram showing a control circuit for speed of a fan motor by using a conventional PWM control method.
Figure 2:
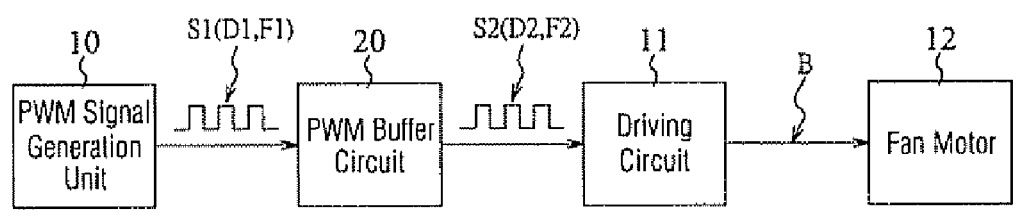
FIG. 2 is a circuit block diagram showing a control circuit for speed of a fan motor arranged with a PWM buffer circuit according to the present invention.

FIG. 2 is a circuit block diagram showing a control circuit for speed of a fan motor arranged with a PWM buffer circuit 20 according to the present invention. Referring to FIG. 2, the present invention is different from the prior art shown in FIG. 1 in that a PWM buffer circuit 20 is arranged between the PWM signal generation unit 10 and the driving circuit 11 such that a PWM signal S1 output from the PWM signal generation unit 10 is firstly converted into a PWM signal S2, which is subsequently input into the driving circuit 11. Based on the PWM signal S2, the driving circuit 11 outputs a driving signal B to the fan motor 12.

More specifically, the PWM buffer circuit 20 converts the PWM signal S1 having the duty cycle D1 and the frequency F1 into the PWM signal S2 having a duty cycle D2 and a frequency F2. In the present invention, the duty cycle D2 and the frequency F2 of the PWM signal S2 are designed to have values that ensure an appropriate control for speed of the fan motor without causing any switching noise. Therefore, with such a configuration, even when the duty cycle D1 and the frequency F1 of the PWM signal S1 do not fall in a range which ensures an appropriate control for speed of the fan motor, an appropriate control for speed of the fan motor is still achieved without causing any switching noise because the driving circuit 11 receives the PWM signal S2, which is the converted signal from the PWM signal S1 by the PWM buffer circuit 20. In other words, the PWM buffer circuit 20 according to the present invention is arranged in the control circuit for speed of the fan motor so as to expand the applicable range of frequency of the PWM signal as well as the applicable range of duty cycle of the PWM signal.

As described in the conventional PWM control method shown in FIG. 1, the frequency of the PWM signal S1 must be higher than 10 kHz and the duty cycle D1 thereof must be restrained between 30% and 85%. However, in one embodiment of the present invention, the PWM buffer circuit 20 is designed to convert a PWM signal S1, which has a frequency higher than 30 Hz and a duty cycle located between 5% and 95%, into a PWM signal S2, which has a frequency F2 higher than 10 kHz and a duty cycle D2 located between 30% and 85%. Consequently, the applicable frequency of the PWM signal S1 is expanded to any of values higher than 30 Hz and the applicable duty cycle thereof is expanded to any of values between 5% and 95% through utilizing the PWM buffer circuit 20 according to the present invention.

Figure 3:
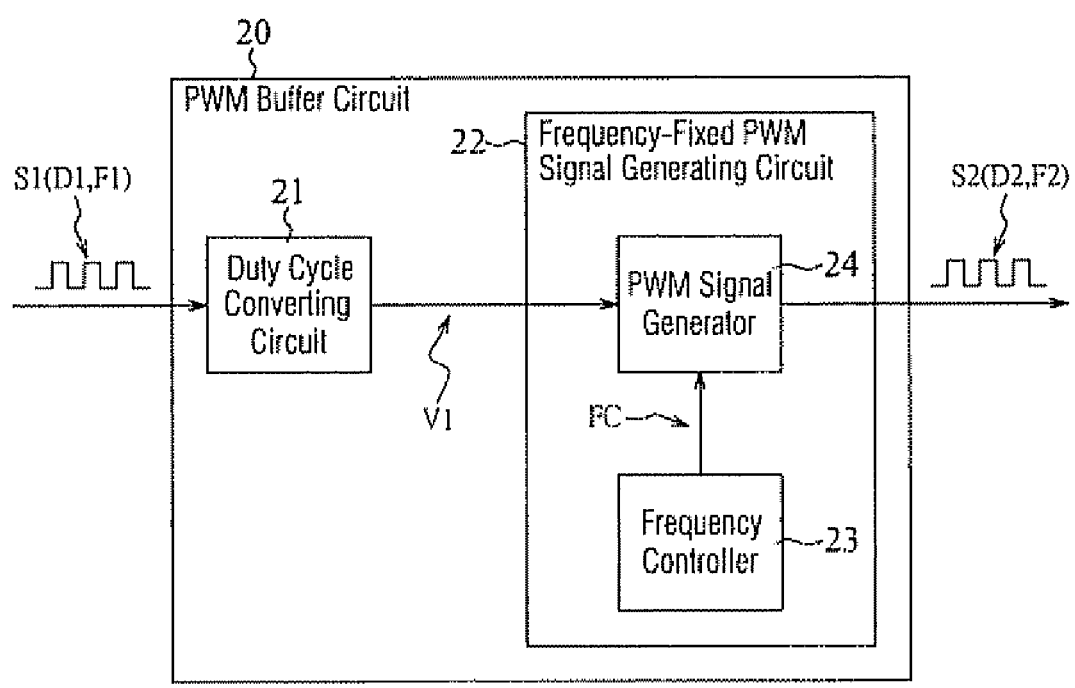
FIG. 3 is a circuit block diagram showing a detailed configuration of a PWM buffer circuit according to the present invention.
Figure 4A:
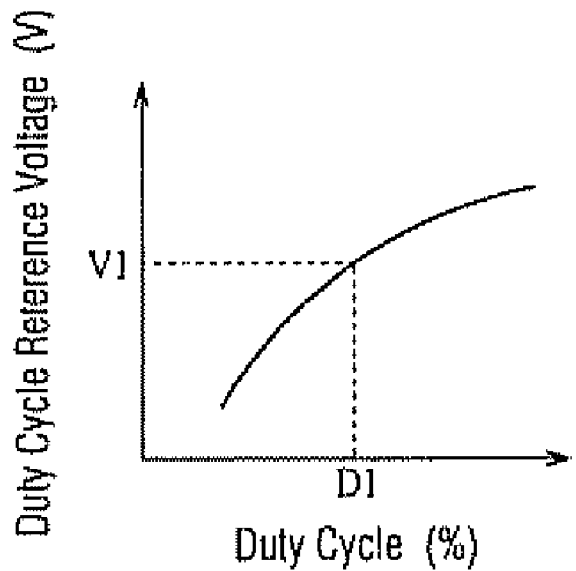
FIG. 4(a) is a graph showing that a duty cycle reference voltage V1 is a one-to-one mapping function of a duty cycle D1 of a PWM signal S1.
Figure 4B:
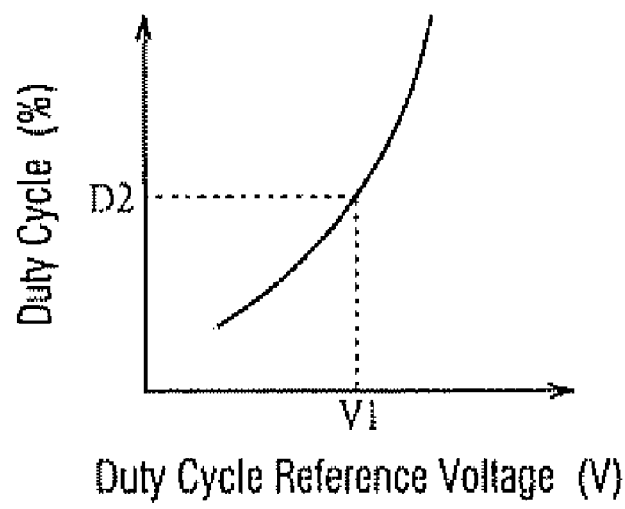
FIG. 4(b) is a graph showing that a duty cycle D2 of a PWM signal S2 is a one-to-one mapping function of a duty cycle reference voltage V1.

FIG. 3 is a circuit block diagram showing a detailed configuration of a PWM buffer circuit 20 according to the present invention. Referring to FIG. 3, the PWM buffer circuit 20 includes a duty cycle converting circuit 21 and a frequency-fixed PWM signal generating circuit 22. More specifically, the duty cycle converting circuit 21 receives the PWM signal S1 and then generates a duty cycle reference voltage V1 based on the duty cycle D1 of the PWM signal S1. In other words, the duty cycle reference voltage V1 is a one-to-one mapping function of the duty cycle D1 of the PWM signal S1, as shown in FIG. 4(a). The frequency-fixed PWM signal generating circuit 22 receives the duty cycle reference voltage V1 and then determines the duty cycle D2 of the PWM signal S2 based on the duty cycle reference voltage V1. In other words, the duty cycle D2 of the PWM signal S2 is a one-to-one mapping function of the duty cycle reference voltage V1, as shown in FIG. 4(b). To sum up, in order to convert the duty cycle D1 into the duty cycle D2, the PWM buffer circuit 20 converts, at a first stage, the duty cycle D1 into the duty cycle reference voltage V1 by utilizing the duty cycle converting circuit 21, followed by converting the duty cycle reference voltage V1 into the duty cycle D2 by utilizing the frequency-fixed PWM signal generating circuit 22 at a second stage.

In addition, the frequency-fixed PWM signal generating circuit 22 generates a PWM signal S2 with a fixed frequency regardless of magnitude of the duty cycle reference voltage V1. Accordingly, the frequency-fixed PWM signal generating circuit 22 is designed to output a PWVM signal S2 with a frequency F2 that is high enough for avoiding switching noise.

In one embodiment of the present invention, the frequency-fixed PWM signal generating circuit 22 may be implemented by a microchip control unit, which is set through software programs to perform the desired functions according to the present invention. In another embodiment of the present invention, the frequency-fixed PWM signal generating circuit 22 includes a frequency controller 23 and a PWM signal generator 24, as shown in FIG. 3. More specifically, the frequency controller 23 provides a frequency control signal FC for determining the frequency of the PWM signal S2 generated by the PWM signal generator 24. Based on the duty cycle reference voltage V1 from the duty cycle converting circuit 21 and the frequency control signal FC from the frequency controller 23, the PWM signal generator 24 generates the PWM signal F2 having the duty cycle D2 and the frequency F2.

Figure 5:
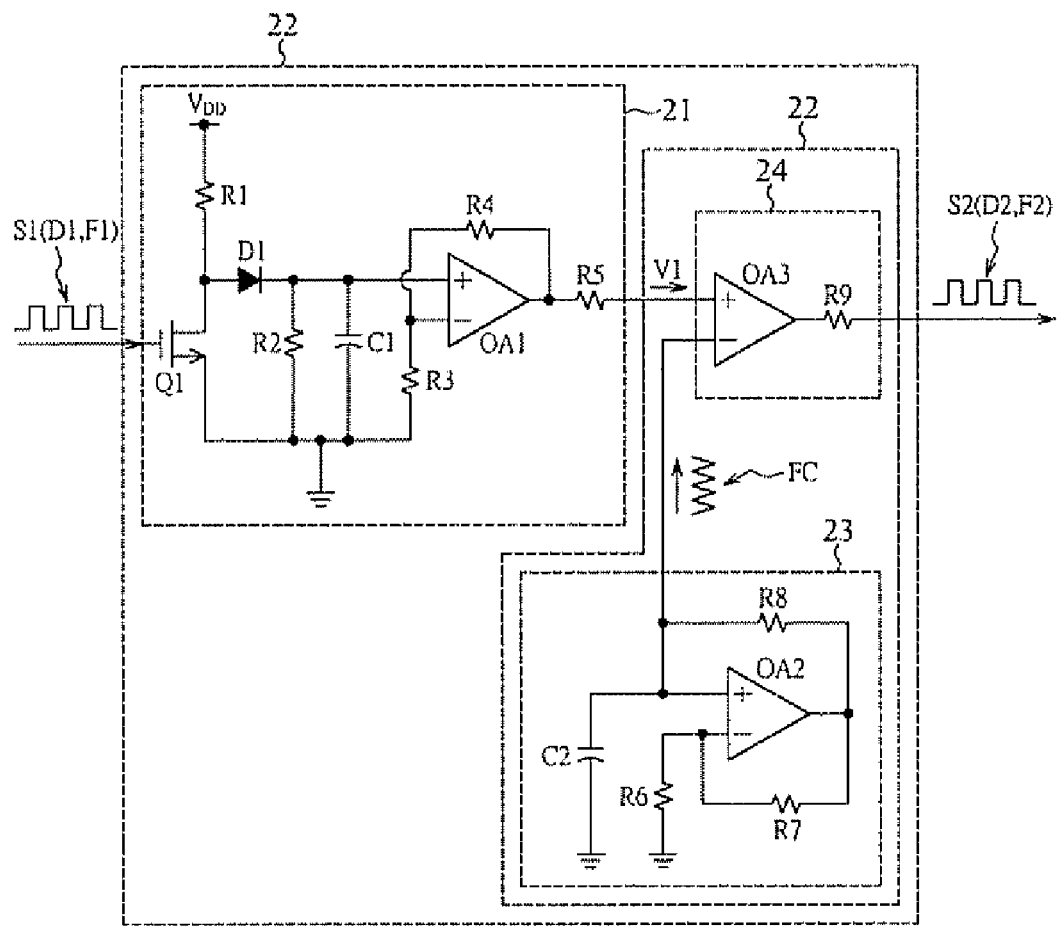
FIG. 5 is a diagram showing one example of a PWM buffer circuit according to the present invention.

FIG. 5 is a diagram showing one example of a PWM buffer circuit 20 according to the present invention. Referring to FIG. 5, the duty cycle converting circuit 21 includes a transistor Q1, a plurality of resistors R1 to R5, a diode Dd1, a capacitor C1, and an operational amplifier OA1. The frequency controller 23 includes a plurality of resistors R6 to R8, a capacitor C2, and an operational OA2. The PWM signal generator 24 includes an operational amplifier OA3 and a resistor R9.

More specifically the transistor Q1 has a gate for receiving the PWM signal S1, a drain coupled to a voltage source $V_{DD}$ through the resistor R1, and a source coupled to ground. The diode Dd1 has a P electrode electrically connected to the drain of the transistor Q1 and an N electrode electrically connected to a non-inverting input terminal of the operational amplifier OA1. The resistor R2 and capacitor C1 are both electrically connected between the N electrode of the diode Dd1 and the ground. The resistor R3 is electrically connected between an inverting input terminal of the operational amplifier OA1 and the ground. The resistor R4 is electrically connected between an output terminal of the operational amplifier OA1 and the ground. The output terminal of the operational amplifier OA1 outputs the duty cycle reference voltage V1 through the resistor R5 to a non-inverting input terminal of the operational amplifier OA3.

The resistor R6 is electrically connected between an inverting input terminal of the operational amplifier OA2 and the ground. The resistor R7 is electrically connected between the inverting input terminal of the operational amplifier OA2 and an output terminal of the operational amplifier OA2. The capacitor C2 is electrically connected between a non-inverting input terminal of the operational amplifier OA2 and the ground. The resistor R8 is electrically connected between the non-inverting input terminal of the operational amplifier OA2 and the output terminal of the operational amplifier OA2. With such a configuration, the output terminal of the operational amplifier OA2 outputs the frequency control signal FC through the resistor R8 to the inverting input terminal of the operational amplifier OA3. In the example shown in FIG. 5, the frequency control signal FC is a continuous triangular wave signal having a frequency f as expressed in Equation (1):

$$f = \frac{1}{2R_8 C_2 \ln\left(1 + 2\frac{R_6}{R_7}\right)} \quad (1)$$

In response to the duty cycle reference voltage V1 received at the non-inverting input terminal of the operational amplifier OA3 and the frequency control signal FC received at the inverting input terminal of the operational amplifier OA3, the operational amplifier OA3 outputs the PWM signal S2 from an output terminal through the resistor R9. More specifically, the operational amplifier OA3 works as a voltage comparator such that the operational amplifier OA3 outputs a higher level state of the PWM signal S2 when the duty cycle reference voltage V1 is larger than the voltage level of the frequency control signal FC whereas the operational amplifier OA3 outputs a lower level state of the PWM signal S2 when the duty cycle reference voltage V1 is smaller than the voltage level of the frequency control signal FC. In such a manner, the PWM signal generator 24 converts the duty cycle reference voltage V1 into the duty cycle D2. In addition, the PWM signal S2 generated by the PWM signal generator 24 has a frequency F2, which is equal to the frequency f of the frequency control signal FC.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A pulse width modulation (PWM) buffer circuit for expanding an applicable range of frequency or duty cycle of a first PWM signal, comprising:
   a duty cycle converting circuit for receiving the first PWM signal and then generating a duty cycle reference voltage based on a first duty cycle of the first PWM signal, wherein the duty cycle reference voltage is a one-to-one mapping function of the first duty cycle, wherein the duty cycle converting circuit comprises:
   a transistor for receiving the first PWM signal;
   a first resistor connected between of the transistor and a voltage source;
   a diode connected to the transistor;
   a second resistor connected between the diode and the ground;
   a first capacitor connected between the diode and the ground;
   a first operational amplifier connected to the diode;
   a third resistor connected between the first operational amplifier and the ground;
   a fourth resistor connected between an inverting input terminal of the first operational amplifier and an output terminal of the first operational amplifier; and
   a fifth resistor connected between the first operational amplifier and the frequency-fixed PWM signal generating circuit; and
   a frequency-fixed PWM signal generating circuit coupled to the duty cycle converting circuit for receiving the duty cycle reference voltage and then outputting a second PWM signal having a fixed frequency, wherein the second PWM signal has a second duty cycle determined on the basis of the duty cycle reference voltage, and the second duty cycle is a one-to-one mapping function of the duty cycle reference voltage.

2. The PWM buffer circuit according to claim 1, wherein the frequency-fixed PWM signal generating circuit is implemented by a microchip control unit set through software programs.

3. The PWM buffer circuit according to. claim 1, wherein the frequency-fixed PWM signal generating circuit comprises:
   a frequency controller for providing a frequency control signal to determine the fixed frequency of the second PWM signal; and
   a PWM signal generator coupled to the duty cycle converting circuit and the frequency controller for generating the second PWM signal in response to the duty cycle reference voltage and the frequency control signal.

4. The PWM buffer circuit according to claim 3, wherein the frequency controller comprises:
   a first operational amplifier;
   a first resistor connected between the first operational amplifier and the ground;
   a second resistor connected between a non-inverting input terminal of the first operational amplifier and an output terminal of the first operational amplifier;
   a first capacitor connected between the first operational amplifier and the ground; and
   an third resistor connected between the non-inverting input terminal of the first operational amplifier and the output terminal of the first operational amplifier.

5. The PWM buffer circuit according to claim 3, wherein the PWM signal generator comprises:
   a first operational amplifier connected to the duty cycle converting circuit for receiving the duty cycle reference voltage and connected to the frequency controller for receiving the frequency control signal, and
   a first resistor connected to the first operational amplifier and outputting the second PWM signal.

6. The PWM buffer circuit according to claim 3, wherein the frequency control signal is a continuous triangular wave signal.

7. The PWM buffer circuit according to claim 1, wherein a frequency of the first PWM signal is higher than 30 Hz and the first duty cycle is located between 5% and 95%, and the fixed frequency of the second PWM signal is higher than 10 kHz.

8. A control circuit for speed of a fan motor, comprising:
   a PWM signal generation unit for generating a first PWM signal having a first duty cycle;
   a PWM buffer circuit for expanding an applicable range of frequency or duty cycle of the first PWM signal, coupled to the PWM signal generation unit for converting the first PWM signal into a second PWM signal having a fixed frequency and a second duty cycle, wherein the PWM buffer circuit comprises:
   a duty cycle converting circuit for receiving the first PWM signal and then generating a duty cycle reference voltage based on the first duty cycle of the first PWM signal, wherein the duty cycle reference voltage is a one-to-one mapping function of the first duty cycle, wherein the duty cycle converting circuit comprises:
   a transistor for receiving the first PWM signal;
   a first resistor connected between the transistor and a voltage source;
   a diode connected to the transistor;
   a second resistor connected between the diode and the ground;
   a first capacitor connected between the diode and the ground;
   a first operational amplifier connected to the diode;
   a third resistor connected between the first operational amplifier and the ground;
   a fourth resistor connected between an inverting input terminal of the first operational amplifier and an output terminal of the first operational amplifier; and a fifth resistor connected between the first operational amplifier and the frequency-fixed PWM signal generating circuit and a frequency-fixed PWM signal generating circuit coupled to the duty cycle converting circuit for receiving the duty cycle reference voltage and then outputting, the second PWM signal, wherein the second duty cycle of the second PWM signal is determined on the basis of the duty cycle reference voltage, and the second duty cycle is a one-to-one mapping function of the duty cycle reference voltage; and a driving circuit coupled to the PWM buffer circuit for outputting a driving signal based on the second PWM signal to the fan motor, thereby controlling the speed of the fan motor.

9. The control circuit according to claim 8, wherein the frequency-fixed PWM signal generating circuit is implemented by a microchip control unit set through software programs.

10. The control circuit according to claim 8, wherein the frequency-fixed PWM signal generating circuit comprises:

a frequency controller for providing a frequency control signal to determine the fixed frequency of the second PWM signal; and a PWM signal generator coupled to the duty cycle converting circuit and the frequency controller for generating the second PWM signal in response to the duty cycle reference voltage and the frequency control signal.

11. The control circuit according to claim 10, wherein the frequency controller comprises:

a first operational amplifier;

a first resistor connected between the first operational amplifier and ground;

a second resistor connected between a non-inverting input terminal of the first operational amplifier and an output terminal of the first operational amplifier;

a first capacitor connected between the first operational amplifier and the ground; and an third resistor connected between the non-inverting input terminal of the first operational amplifier and the output terminal of the first operational amplifier.

12. The control circuit according to claim 10, wherein the PWM signal generator comprises:

a first operational amplifier connected to the duty cycle converting circuit for receiving the duty cycle reference voltage, and connected to the frequency controller for receiving the frequency control signal; and a first resistor connected to the first operational amplifier and outputting the second PWM signal.

13. The control circuit according to claim 10, wherein the frequency control signal is a continuous triangular wave signal.

14. The control circuit according to claim 8, wherein a frequency of the first PWM signal is higher than 30 Hz and the first duty cycle is located between 5% and 95%.

15. The control circuit according to claim 8, wherein the fixed frequency of the second PWM signal is higher than 10 kHz.

* * * * *